(12) United States Patent
Nakashima

(10) Patent No.: US 8,076,225 B2
(45) Date of Patent: Dec. 13, 2011

(54) SOLID-STATE IMAGE CAPTURING DEVICE, MANUFACTURING METHOD FOR THE SAME AND ELECTRONIC INFORMATION DEVICE

(75) Inventor: Yoshimitsu Nakashima, Nara (JP)

(73) Assignee: Sharp Kabushiki Kaisha, Osaka (JP)

(*) Notice: Subject to any disclaimer, the term of this patent is extended or adjusted under 35 U.S.C. 154(b) by 530 days.

(21) Appl. No.: 11/594,523

(22) Filed: Nov. 7, 2006

(65) Prior Publication Data
US 2007/0128841 A1    Jun. 7, 2007

(30) Foreign Application Priority Data
Nov. 7, 2005 (JP) .................. 2005-322546

(51) Int. Cl.
*H01L 21/04* (2006.01)
(52) U.S. Cl. . 438/510; 438/514; 257/414; 257/E27.122; 257/E27.133
(58) Field of Classification Search .................. 438/510, 438/514; 257/414–470, E27.122, E27.133
See application file for complete search history.

(56) References Cited

U.S. PATENT DOCUMENTS
6,730,899 B1 * 5/2004 Stevens et al. ............. 250/208.1

FOREIGN PATENT DOCUMENTS
JP      11-126893      5/1999
* cited by examiner

*Primary Examiner* — Khiem D Nguyen
(74) *Attorney, Agent, or Firm* — Edwards Wildman Palmer LLP; David G. Conlin; William J. Daley, Jr.

(57) ABSTRACT

A method for manufacturing a solid-state image capturing device according to the present invention, in which from a plurality of light receiving sections for photoelectrically converting incident light into signal electric charge, the signal electric charge is read to an electric charge detection section through transfer sections located under respective reading gate electrodes, each electric charge detection being shared by each of the plurality of light receiving sections, the method including: transfer section impurity region forming step of performing an ion implantation process from an ion implantation direction wherein the location of an edge surface of an impurity region of the transfer section and the location of an edge surface of the reading gate electrode corresponding to the impurity region match each other at each reading gate electrode.

22 Claims, 10 Drawing Sheets

FIG.1
(a)
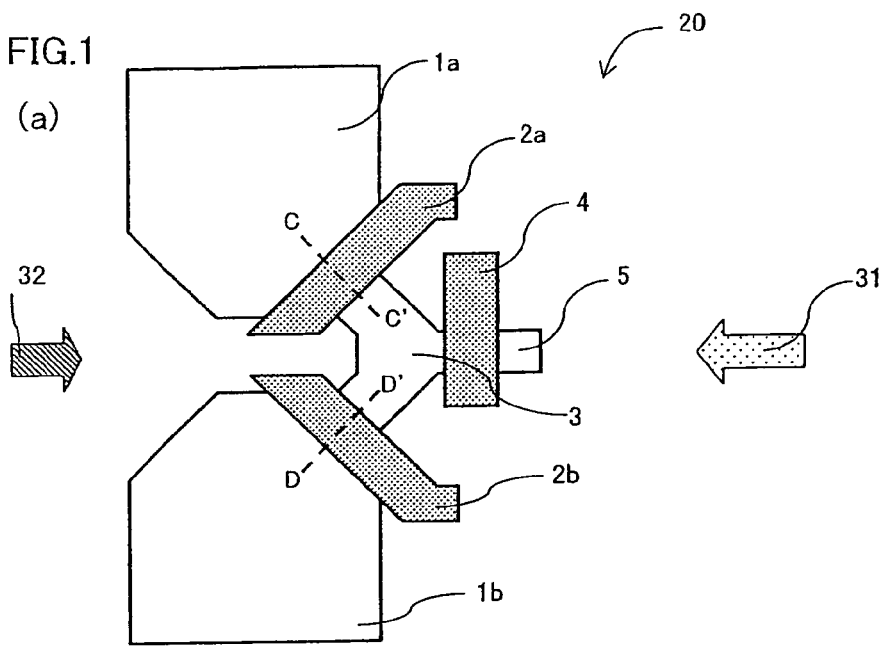
(b)
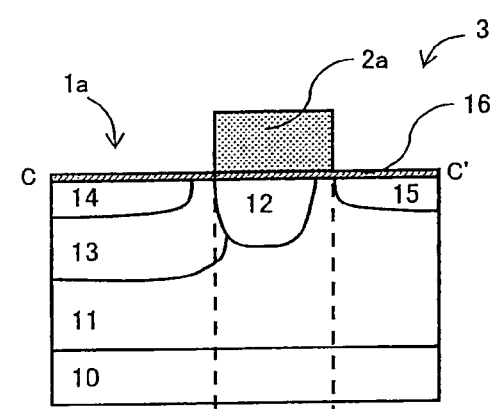
(c)
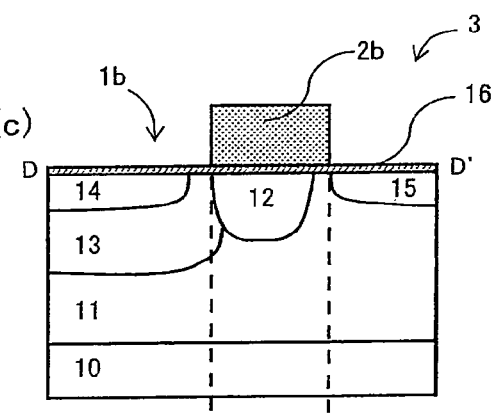
(d)
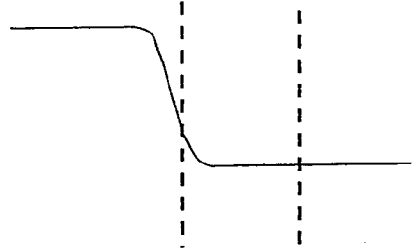
(e)
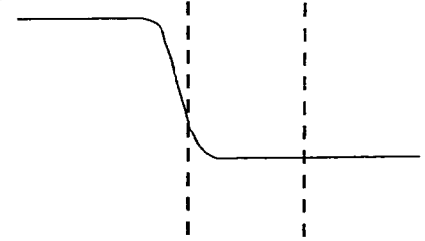

FIG.2
(a) 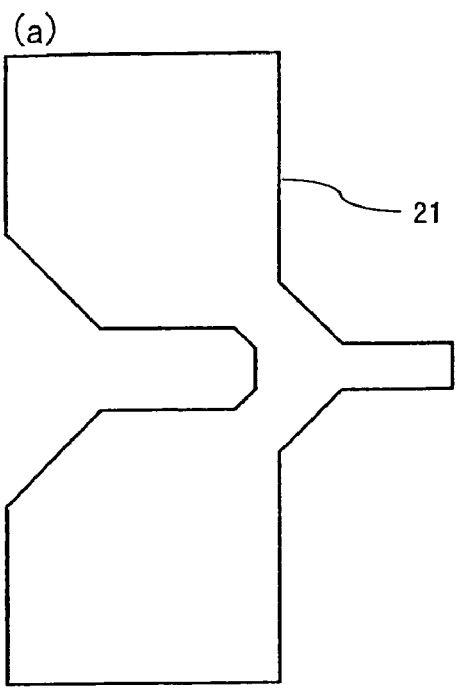
(b) 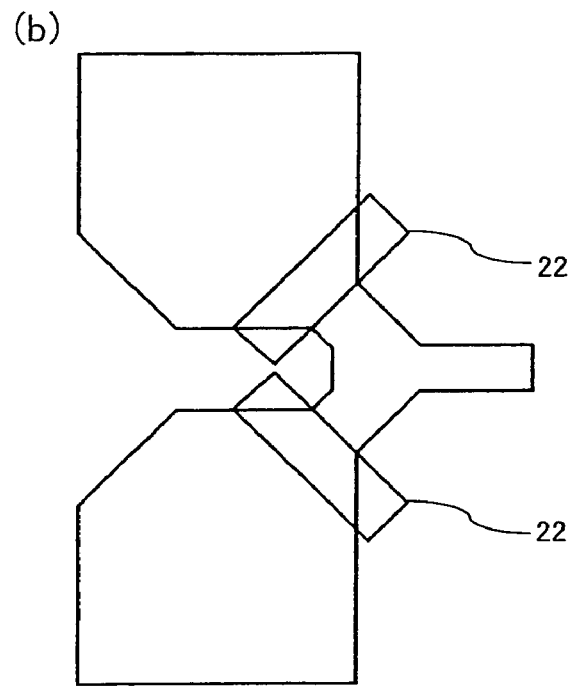
(c) 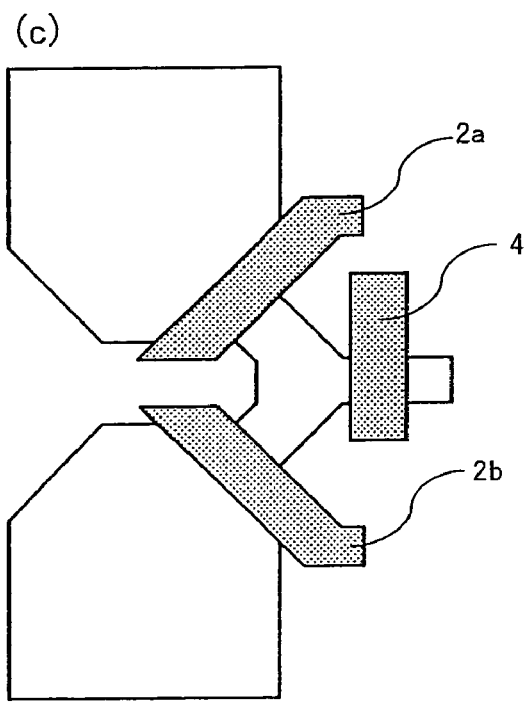
(d) 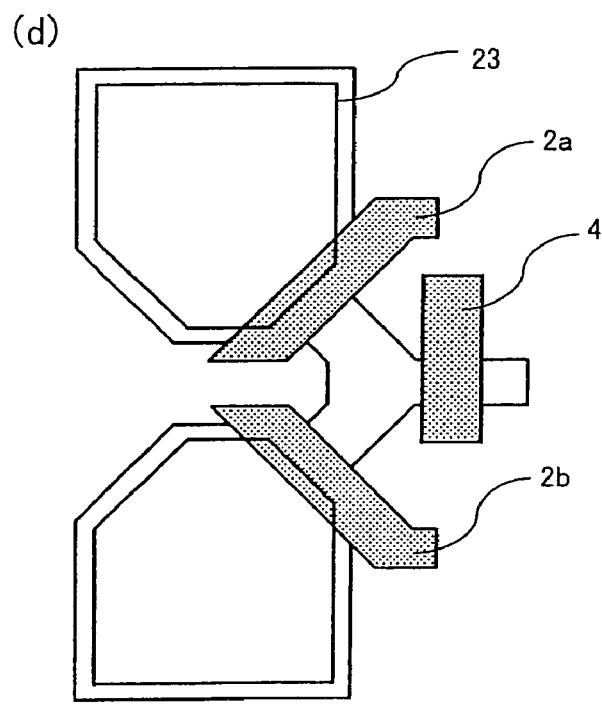

FIG.3
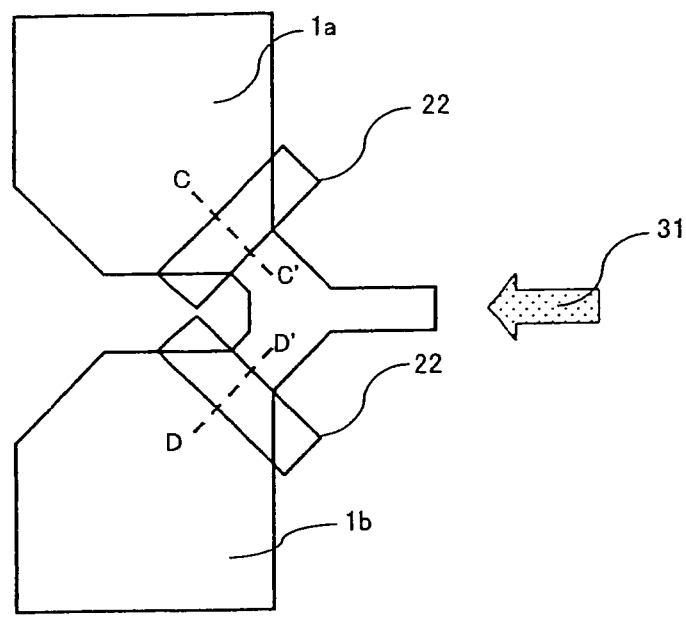
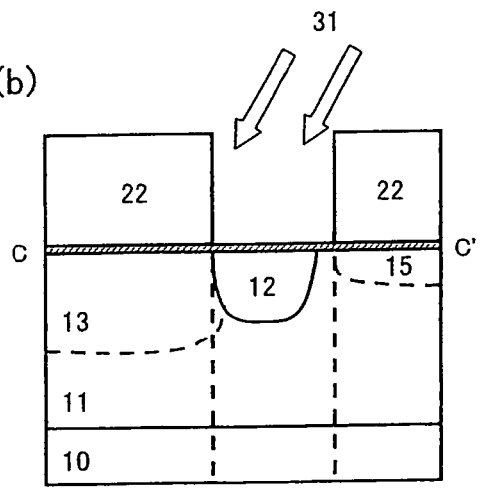
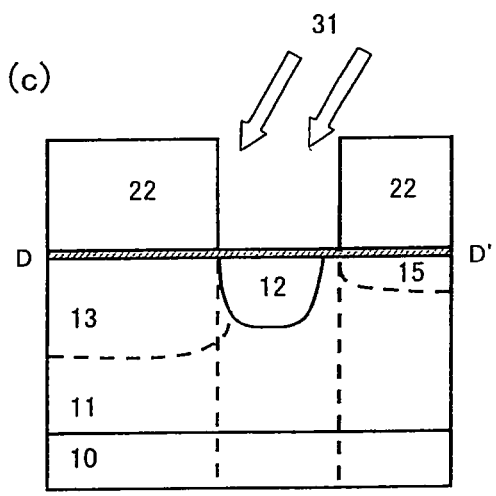

FIG.7
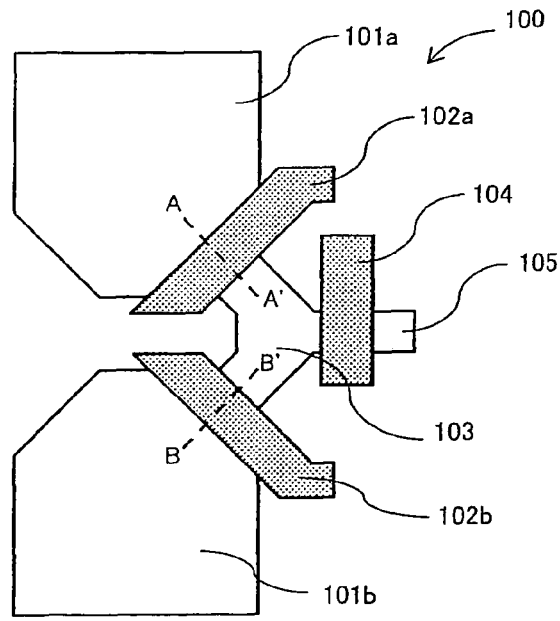
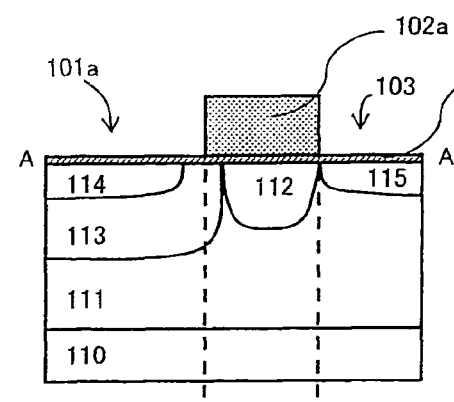
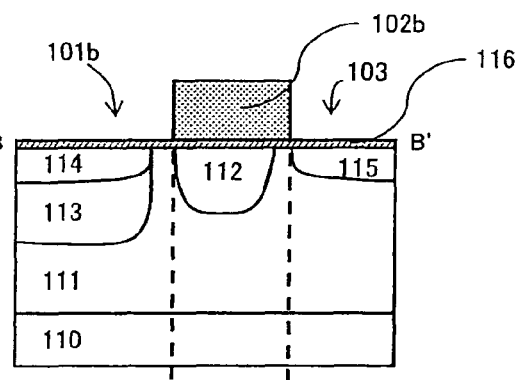
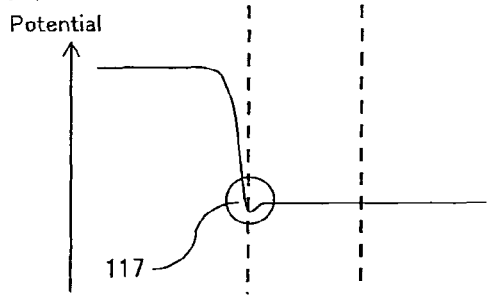
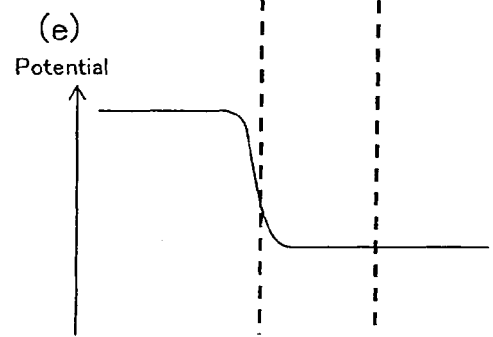

FIG. 9
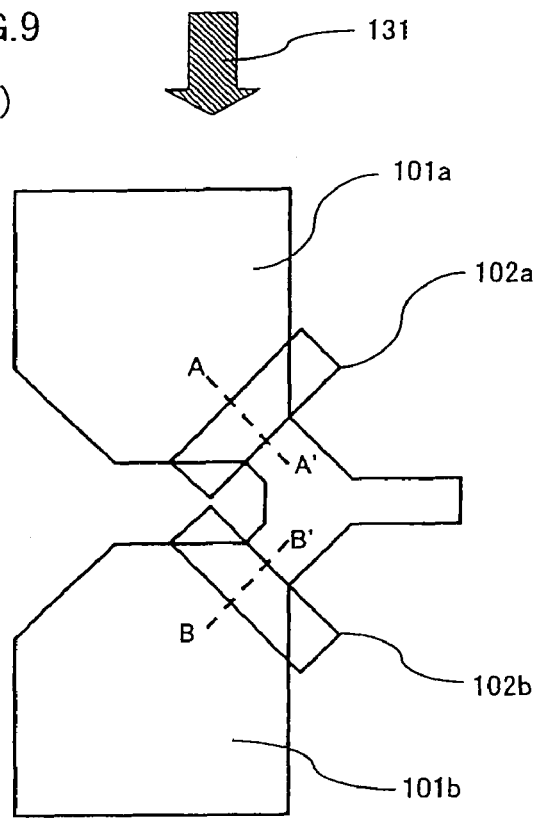
(a)
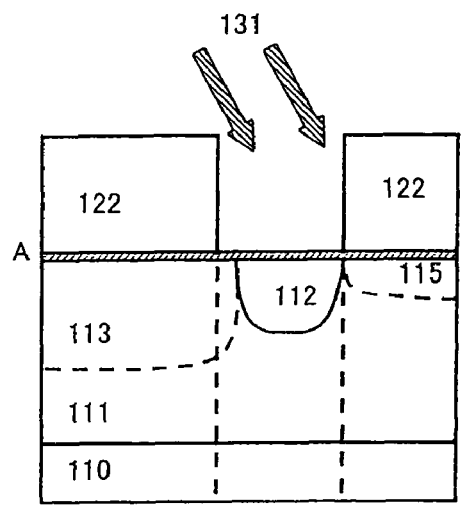
(b)
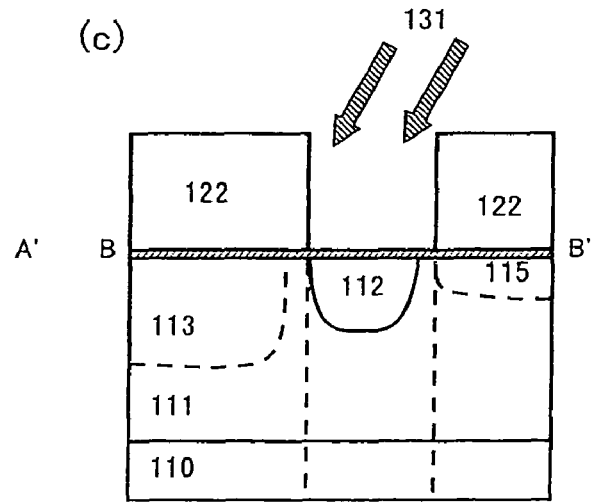
(c)

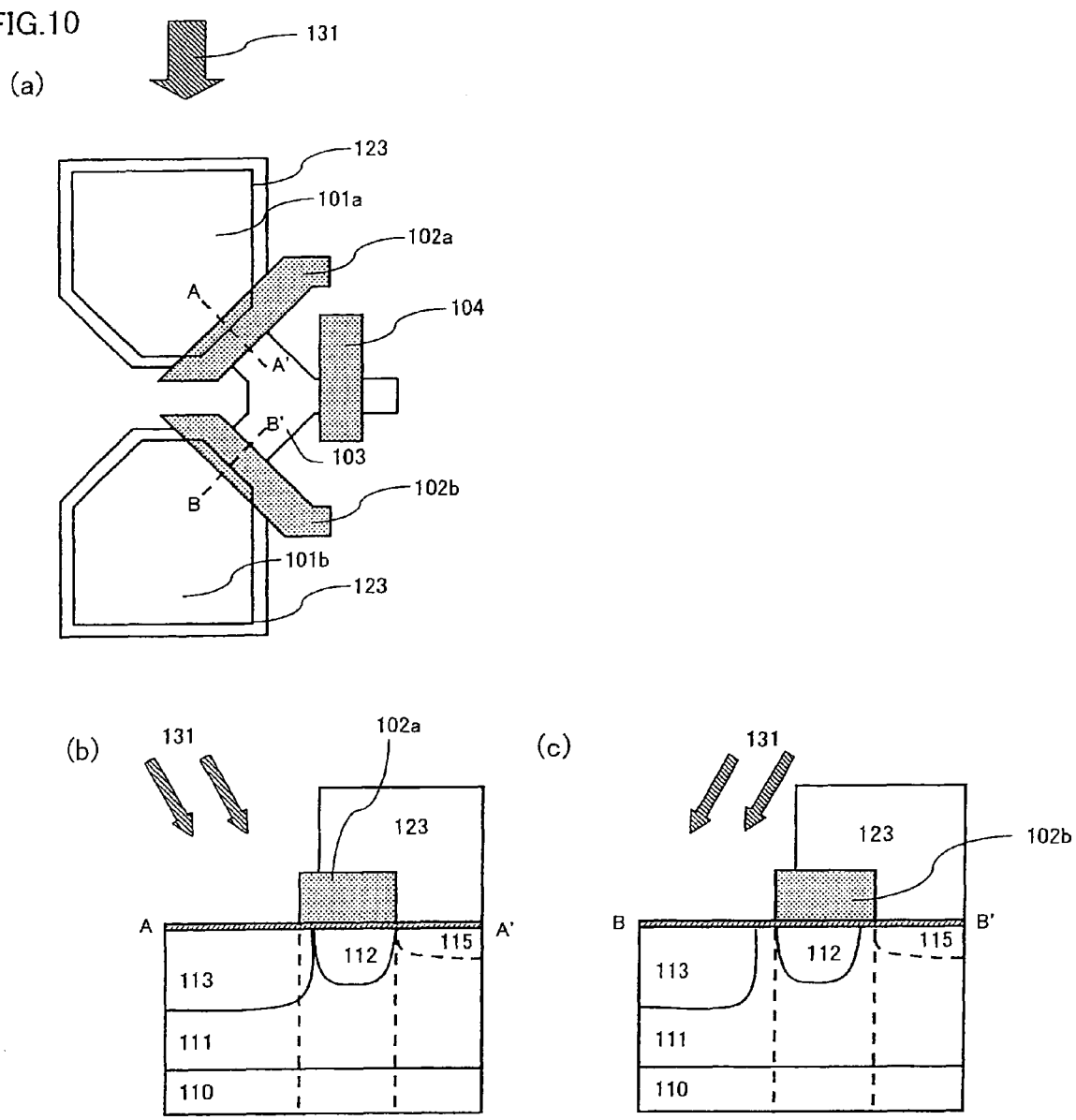

SOLID-STATE IMAGE CAPTURING DEVICE, MANUFACTURING METHOD FOR THE SAME AND ELECTRONIC INFORMATION DEVICE

This Nonprovisional application claims priority under 35 U.S.C. §119(a) on Patent Application No. 2005-322546 filed in Japan on Nov. 07, 2005, the entire contents of which are hereby incorporated by reference.

BACKGROUND OF THE INVENTION

1. Field of the Invention:

The present invention relates to: a solid-state image capturing device capable of making the reading characteristic in each of a plurality of pixel sections consistent when an electric charge detection section is shared by the plurality of pixel sections; a method for manufacturing the solid-state image capturing device; and an electronic information device having, for example, a digital camera (e.g., digital video camera and digital still camera) or an image input device (e.g., image input camera, scanner, facsimile and cellar phone device equipped with a camera) using the solid-state image capturing device as an image capturing section therein.

2. Description of the Related Art:

As a conventional solid-state image capturing device, a CMOS-type (complementary metal oxide semiconductor) solid-state image capturing device is known, in which the following constituents are provided on a substrate and a plurality of each of the constituents is provided in two dimensions: a plurality of light receiving sections for converting incident light into signal electric charge and accumulating the signal electric charge; transfer sections for reading the signal electric charge accumulated in the respective light receiving sections; reading gate electrodes provided over the respective transfer sections in order to control the reading of the signal electric charge accumulated in the respective light receiving sections; and an electric charge detection section shared by the light receiving sections of two or more pixels in order to detect the read signal electric charge.

Hereinafter, the conventional CMOS-type solid image capturing device will be described with reference to FIGS. 7 to 10. First, a structural example of the conventional CMOS-type solid image capturing device will be described in detail with reference to FIG. 7.

Portion (a) of FIG. 7 is a top view showing a structure of the conventional CMOS-type solid image capturing device. Portion (b) of FIG. 7 is a cross-sectional view of Portion (a) of FIG. 7 cut by a line A-A'. Portion (c) of FIG. 7 is a cross-sectional view of Portion (a) of FIG. 7 cut by a line B-B'. Portion (d) of FIG. 7 is a view showing potential, of Portion (a) of FIG. 7 cut by a line A-A', at the time of electric charge transfer. Portion (e) of FIG. 7 is a view showing potential, of Portion (a) of FIG. 7 cut by a line B-B', at the time of electric charge transfer.

In Portions (a) to (a) of FIG. 7, for each unit of two pixel sections, light receiving sections 101a and 101b; reading gate electrodes 102a and 102b; and an electric charge detection section 103 shared by the light receiving sections 101a and 101b are provided in the conventional solid-state image capturing device 100. Further, a reset gate electrode 104 and a reset drain section 105 for resetting signal electric charge of the electric charge detection section 103 are provided in this conventional solid-state image capturing device 100.

As each of the light receiving sections 101a and 101b, an electric charge accumulation region 113 made of an N-type impurity diffusion layer is provided on a P-type diffusion layer 111 over an N-type semiconductor substrate 110. A P+region 114 is provided at the top of each of the light receiving sections 101a and 101b. Each of the reading gate electrodes 102a and 102b is provided over a P-type impurity region 112 with a gate oxide film 116 therebetween wherein the P-type impurity region 112 makes up a transfer section. The reading gate electrodes 102a and 102b are provided in order to control a reading voltage of the respective transfer sections and the like. In addition, the electric charge detection section 103 is made up of an N-type impurity region 115.

An operation of the conventional CMOS-type solid image capturing device 100 having the structure described above will be described.

First, light (subject light) which is incident on an image capturing region of the CMOS-type solid-state image capturing device 100 is photoelectrically converted into signal electric charge at the light receiving sections 101a and 101b, respectively. The signal electric charge photoelectrically converted at the light receiving sections 101a and 101b respectively is once accumulated in the respective electric charge accumulation regions 113 of the light receiving sections 101a and 101b.

Next, a predetermined voltage is applied to the reading gate electrodes 102a and 102b so as to read the signal electric charge accumulated in each of the respective light receiving sections 101a and 101b to the electric charge detection section 103 via the P-type impurity region 112 of the transfer section.

An image capturing signal can be obtained by amplifying potential corresponding to the signal electric charge read to each of the electric charge sections 103.

A method for manufacturing the conventional CMOS-type solid-state image capturing device 100 will be described with reference to FIGS. 7 and 8.

Portions (a) to (d) of FIG. 8 each show a top view for explaining the method for manufacturing the conventional solid-state image capturing device 100.

As shown in Portions (b) and (c) of FIG. 7, in manufacturing the conventional CMOS-type solid-state image capturing device 100, first, an ion implantation process with boron or the like and a thermal treatment are performed on the N-type semiconductor substrate 110 so as to form the P-type diffusion layer (P well) 111.

Next, as shown in Portion (a) of FIG. 8, a thermal oxide film (not shown) for separating an active region and an inactive region is formed by using a resist pattern 121 (having an opening therein) is formed on the P-type diffusion layer (P well) 111.

Further, as shown in Portion (b) of FIG. 8, an ion implantation process with boron or the like is preformed on the P-type diffusion layer (P well) 111 by using a resist pattern 122 (having an opening therein). As a result, as shown in Portions (b) and (c) of FIG. 7, the impurity region 112 for controlling the reading voltage of the transfer section is formed.

Next, a gate oxide film 116 shown in Portions (b) and (c) of FIG. 7 is formed on the surface of the N-type semiconductor substrate 110 by performing a thermal oxidation treatment at a temperature of 1000 degrees Celsius to 1100 degrees Celsius in an atmosphere Of $O_2$ gas and HCl gas.

Thereafter, a multi-layered film, in which, for example, a poli-silicon film and a W (tungsten) film are layered, is formed by performing a CVD (Chemical Vapour Deposition) method and a sputtering method. Then, a dry etching is performed on the resultant film. As a result, the reading gate electrodes 102a and 102b and the reset gate electrode 104 are formed, as shown in Portion (c) of FIG. 8.

Further, as shown in Portion (d) of FIG. 8, an ion implantation process with phosphorus or arsenic and a thermal treatment are performed, by using a resist pattern 123 (having an opening therein) on a location corresponding to each of the light receiving sections 101a and 101b on the gate oxide film 116. As a result as shown in Portions (b) and (c) of FIG. 7, the N-type impurity region is formed wherein the N-type impurity region will become the electric charge accumulation region 113 of each of the light receiving sections 101a and 101b. The electric charge accumulation regions 113 are formed in a manner of self-alignment with respect to the respective reading gate electrodes 102a and 102b.

Further, an ion implantation process with arsenic or the like is performed by using a pattern (not shown) so as to form the electric charge detection section 103 (N-type impurity region 115) and the reset drain section 105, as shown in Portions (a) to (c) of FIG. 7.

Thereafter, an ion implantation process with boron or the like is performed by using a pattern (not shown) so as to form the surface P+ region 114 of each of the light receiving sections 101a and 101b, as shown in Portions (a) to (c) of FIG. 7.

Herein, shown in Portions (a) to (c) of FIG. 7, the structure having each electric charge detection section 103 shared by the two light receiving section 101a and 101b respectively arranged in upper and lower positions in a plane will be described.

When each electric charge detection section 103 is shared by the two light receiving section 101a and 101b respectively arranged in the upper and lower positions, it is possible to secure a large size of the light receiving sections 101a and 101b due to sharing of the electric detection section 103, compared to the case when the electric charge detection section 103 is provided for each pixel. Thus, sensitivity characteristic to incident light can be improved.

As described above, in the conventional solid-state image capturing device 100 in which the electric charge detection section 103 is shared by a plurality of light receiving sections 101a and 101b, an image capturing signal with good quality can be obtained by controlling an electric charge accumulation, electric charge reading and reset operation, with a good timing, at the light receiving section 101a and 101b respectively arranged in the upper and lower positions when the electric charge reading operation is performed.

For example, Reference 1 discloses a solid-state image capturing device capable of: completely transferring signal electric charge without generating any depression (corresponding to a depression 117 shown in Portion (b) of FIG. 7) in the potential of the transfer section at the time of electric charge transfer; and suppressing the occurrence of a residual image, by forming an overlap of the electric charge accumulation layer of each of the light receiving sections and the surface P+ layer with an excellent controllability.

[Reference 1] Japanese Laid-Open Publication No. 11-126893

SUMMARY OF THE INVENTION

In the conventional CMOS-type solid-state image capturing device described above, it is known that the electric charge reading operation from the light receiving sections 101a and 101b to the electric charge detection sections 103 is greatly influenced by a formed state of the P-type impurity region 112, which makes up the transfer section. The reason for this is because an amount of electric charge accumulable in the light receiving section and a reading voltage for reading the accumulated electric charge are influenced by the height of a potential barrier in the transfer section. Thus, the formed state of the P-type impurity region 112 of the transfer section greatly influences the characteristic of the CMOS-type solid-state image capturing device 100.

A formed state of the electric charge accumulation region 113 of each of the light receiving sections 101a and 101b and a formed state of the P-type impurity region 112 of the transfer section in the conventional CMOS-type solid-state image capturing device 100 described above will be described with reference to FIGS. 9 and 10.

Portion (a) of FIG. 9 is a top view for explaining the formed state of the electric charge accumulation region of each of the light receiving sections in the solid-state image capturing device shown in FIG. 7. Portion (b) of FIG. 9 is a cross-sectional view of Portion (a) of FIG. 9 cut by a line A-A'. Portion (c) of FIG. 9 is a cross-sectional view of Portion (a) of FIG. 9 cut by a line B-B'. Portion (a) of FIG. 10 is a top view for explaining the formed state of the impurity region of each of the transfer sections in the solid-state image capturing device shown in FIG. 7. Portion (b) of FIG. 10 is a cross-sectional view of Portion (a) of FIG. 10 cut by a line A-A'. Portion (c). of FIG. 10 is a cross-sectional view of Portion (a) of FIG. 10 cut by a line B-B'.

In manufacturing the conventional CMOS-type solid image capturing device 100, the electric charge accumulation region 113 of each of the light receiving sections 101a and 101b and the impurity region 112 of each of the transfer sections are formed by performing an ion implantation process. As shown in FIGS. 9 and 10, the ion implantation process of this time is performed by using the resist patterns 122 and 123 and it is performed on the light receiving sections 101a and 101b respectively arranged in the upper and lower positions from a direction 131 (from top to bottom in the figure), having 7 degrees of inclination angle with respect to a direction perpendicular to the plain surface of the substrate.

In this case, each formed state (location) of the electric charge accumulation region 113 of each of the light receiving sections 101a and 101b respectively arranged in the upper and lower positions in a plane with respect to each of the respective reading gate electrodes 102a and 102b is different from each other, and each formed state of the impurity region 112 of each of the transfer sections with respect to each of the respective reading gate electrodes 102a and 102b is different from each other. For example, the electric charge accumulation region 113 in the light receiving section 101a arranged in the upper position is formed so as to extend underneath the reading gate electrode 102a, as shown in Portion (b) of FIG. 10. Also, the impurity region 112 of the transfer section is formed more towards the side of to the electric charge detection section 103 (impurity region 115) due to the influence of the shadowing of the resist pattern 122, as shown in Portion (b) of FIG. 9. In contrast, the electric charge accumulation region 113 in the light receiving section 101b arranged in the lower position is formed so as to be away from the reading gate electrode 102b (impurity region 112) due to the influence of the shadowing of the resist pattern 123, as shown in Portion (c) of FIG. 10. Also, the impurity region 112 of the transfer section is formed more towards the side of the light receiving section 101b (electric charge accumulation region 113) due to the influence of the shadowing of the resist pattern 122, as shown in Portion (c) of FIG. 9.

As described above, when the inconsistency of the formed position between each respective electric charge accumulation region 113 and between each respective impurity region 112 occurs, a problem of causing the inconsistency of the reading characteristic from each of the light receiving section 101a and 101b occurs. This problem will be described with reference to Portions (d) and (e) of FIG. 7.

In Portions (d) and (e) of FIG. 7, vertical axes each show potential along a left-to-right position of each of corresponding sections. At the time of electric charge transfer, the potential of the transfer section is lowered by applying a predetermined voltage to the reading gate electrodes 102a and 102b. As a result, the signal electric charge accumulated in the light receiving section (electric charge accumulation region 113) are read to the electric charge detection section 103 (impurity region 115) through the transfer section (impurity region 112).

As shown in Portion (b) of FIG. 7, in the light receiving section 101a arranged in the upper position, the electric charge accumulation region 113 is formed so as to extend underneath the reading gate electrode 102a and the impurity region 112 of the transfer section is formed more towards the side of the electric charge detection section 103 (impurity region 115). In this case, as indicated by the circle in Portion (d) of FIG. 7, the depression 117 in the potential occurs in the electric charge accumulation region 113 extending to the impurity region 112 of the transfer section at the time of electric charge transfer of each of pixel sections respectively arranged in the upper and lower positions. When such a depression 117 in the potential occurs, the signal electric charge is not completely transferred, thereby generating a residual image and causing a problem of aggravating the state of an image capturing screen.

On the other hand, as shown in Portion (c) of FIG. 7, in the light receiving section 101b arranged in the lower position, the electric charge accumulation region 113 is formed so as to be away from the reading gate electrode 102b and the impurity region 112 of the transfer section is formed more towards the side of the light receiving section 101b. In this case, no depression in the potential occurs as shown in Portion (e) of FIG. 7. Thus, the signal electric charge is not left in the electric charge accumulation region 113 as it happens in the case of the light receiving section 101a arranged in the upper position. Accordingly, the reading characteristic is different between the light receiving section 101a arranged in the upper position and the light receiving section 101b arranged in the lower position.

In contrast, the solid-state image capturing device disclosed in Reference 1, as described above, the overlap of the electric charge accumulation region of each of the light receiving sections and the surface P+ layer is formed with an excellent controllability. As a result, the signal electric charge is completely transferred without generating any depression in the potential of the transfer section at the time of electric charge transfer; and the occurrence of a residual image can be suppressed.

However, Reference 1 does not describe an ion implantation direction for the electric charge accumulation region 113 and the impurity region 112. When ion implantation processes are performed on the electric charge accumulation region 113 and the impurity region 112 in an implantation direction 131, respectively, shown in FIGS. 9 and 10, the location of the electric charge accumulation region 113 with respect to the reading gate electrode in each of the pixel sections respectively arranged in the upper and lower positions is inconsistent, and the location of the impurity region 112 with respect to the reading gate electrode in each of the pixel sections respectively arranged in the upper and lower positions is inconsistent. Thus, a problem similar to the one described above occurs.

The present invention is intended to solve the conventional problem described above. The objective of the present invention is to provide: a solid-state image capturing device capable of making the reading characteristic of each light receiving section consistent and reducing a reading voltage; a method for manufacturing the solid-state image capturing device; and an electric information device using the solid-state image capturing device therein.

A method for manufacturing a solid-state image capturing device according to the present invention is provided, in which from a plurality of light receiving sections for photoelectrically converting incident light into signal electric charge, the signal electric charge is read to an electric charge detection section through transfer sections located under respective reading gate electrodes, each electric charge detection being shared by each of the plurality of light receiving sections, the method includes: transfer section impurity region forming step of performing an ion implantation process from an ion implantation direction wherein the location of an edge surface of an impurity region of the transfer section and the location of an edge surface of the reading gate electrode corresponding to the impurity region match each other at each reading gate electrode, thereby the objective described above being achieved.

A method for manufacturing a solid-state image capturing device according to the present invention is provided, in which from a plurality of light receiving sections for photoelectrically converting incident light into signal electric charge, the signal electric charge is read to an electric charge detection section through transfer sections located under respective reading gate electrodes, each electric charge detection being shared by each of the plurality of light receiving sections, the method includes: transfer section impurity region forming step of performing an ion implantation process from an ion implantation direction wherein the location of an edge surface of an impurity region of the transfer section and the location of an edge surface of the reading gate electrode corresponding to the impurity region match each other at each reading gate electrode; and electric charge accumulation forming step of performing an ion implantation process from an ion implantation direction wherein the location of an edge surface of an electric charge accumulation region of the light receiving section and the location of an edge surface of the reading gate electrode corresponding to the electric charge accumulation region match each other at each of the light receiving sections, thereby the objective described above being achieved.

A method for manufacturing a solid-state image capturing device according to the present is provided, the solid-state image capturing device including: on a semiconductor substrate, a plurality of light receiving sections for converting incident light into signal electric charge and accumulating the signal electric charge; transfer sections for reading the signal electric charge accumulated in the plurality of respective light receiving sections; reading gate electrodes provided over the respective transfer sections in order to control the reading of the signal electric charge accumulated in the plurality of respective light receiving sections; and an electric charge detection section shared by the light receiving sections of a plurality of pixels in order to detect the signal electric charge read through the respective transfer sections, the method including: transfer section impurity region forming step of setting an ion implantation direction such that the location of an impurity region of each of the transfer sections with respect to each of the respective reading gate electrodes is consistent and performing an ion implantation so as to form the impurity region of each of the transfer sections; and electric charge accumulation region forming step of setting an ion implantation direction such that the location of an electric charge accumulation region of each of the light receiving sections with respect to each of the respective reading gate electrodes is consistent and performing an ion implantation so as to form the electric charge accumulation region of each of the light receiving sections, thereby the objective described above being achieved.

Preferably, in a method for manufacturing a solid-state image capturing device according to the present invention, the plurality of light receiving sections sharing the electric charge detection section is arranged and formed in one line on the semiconductor substrate, the transfer section impurity region forming step performs the ion implantation process from a direction vertical to an arrangement direction of the plurality of light receiving sections having a predetermined inclination angle from a direction perpendicular to a surface of the semiconductor substrate such that the location of the impurity region making up each of the transfer sections with respect to each of the respective reading gate electrodes is consistent, and the electric charge accumulation region forming step performs the ion implantation process from a direction vertical to an arrangement direction of the plurality of light receiving sections having a predetermined inclination angle from a direction perpendicular to the surface of the semiconductor substrate such that the location of the electric charge accumulation region making up each of the plurality of light receiving sections with respect to each of the respective reading gate electrodes is consistent.

Further, preferably, in a method for manufacturing a solid-state image capturing device according to the present invention, the plurality of light receiving sections sharing the electric charge detection section is arranged on the semiconductor substrate in a top/bottom direction, a left/right direction or a diagonal direction.

Further, preferably, in a method for manufacturing a solid-state image capturing device according to the present invention, the plurality of light receiving sections sharing the electric charge detection section is arranged and formed on the semiconductor substrate in a plurality of directions, the transfer section impurity region forming step performs the ion implantation process by changing the ion implantation direction with respect to the semiconductor substrate, so that the ion implantation process is performed from a direction vertical to an arrangement direction of the plurality of light receiving sections having a predetermined inclination angle from a direction perpendicular to a surface of the semiconductor substrate such that the location of the impurity region making up each of the transfer sections with respect to each of the respective reading gate electrodes is consistent, and the electric charge accumulation region forming step performs the ion implantation process by changing the ion implantation direction with respect to the semiconductor substrate, so that the ion implantation process is performed from a direction vertical to an arrangement direction of the plurality of light receiving sections having a predetermined inclination angle from a direction perpendicular to the surface of the semiconductor substrate such that the location of the electric charge accumulation region making up each of the light receiving sections with respect to each of the respective reading gate electrodes is consistent.

Further, preferably, in a method for manufacturing a solid-state image capturing device according to the present invention, the plurality of light receiving sections sharing the electric charge detection section is arranged on the semiconductor substrate in a top/bottom direction and a left/right direction.

Further, preferably, in a method for manufacturing a solid-state image capturing device according to the present invention, the transfer section impurity region forming step performs the ion implantation process from a direction opposite to the light receiving section with respect to the reading gate electrode such that the impurity region of the transfer section is formed adjacent to the light receiving section.

Further, preferably, in a method for manufacturing a solid-state image capturing device according to the present invention, the electric charge accumulation region forming step performs the ion implantation process from a direction on the side of the light receiving section with respect to the reading gate electrode such that the electric charge accumulation region is formed so as to extend underneath the impurity region of the transfer section located under the reading gate electrode.

Further, preferably, in a method for manufacturing a solid-state image capturing device according to the present invention, arsenic or phosphorus is implanted into a P-type diffusion layer on an N-type semiconductor substrate in order to form the electric charge accumulation region of the light receiving section, and boron is implanted into the P-type diffusion layer on the N-type semiconductor substrate in order to form the impurity region of the transfer section.

Further, preferably, in a method for manufacturing a solid-state image capturing device according to the present invention, the vertical direction in the transfer section impurity region forming step and the vertical direction in the electric charge accumulation region forming step are opposite to each other and face each other.

Further, preferably, in a method for manufacturing a solid-state image capturing device according to the present invention, the changing the ion implantation direction in the transfer impurity region forming step and the changing the ion implantation direction in the electric charge accumulation region forming step are performed by rotating the semiconductor substrate or the ion implantation direction.

A solid-state image capturing device according to the present invention is manufactured by a method for manufacturing a solid-state image capturing device described above, the location of an electric charge accumulation region making up each of plurality of light receiving sections sharing an electric charge detection section with respect to each of respective reading gate electrodes is consistent, and the location of an impurity region making up each of transfer sections with respect to each of the respective reading gate electrodes is consistent, thereby the objective described above being achieved.

An electronic information device according to the present invention uses a solid-state image capturing device described above as an image capturing section therein, thereby the objective described above being achieved.

Owing to the structure described above, the function of the present invention will be described hereinafter.

According to the present invention, in a solid-state image capturing device having an electric charge detection section shared by each of a plurality of light receiving sections, an ion implantation direction is set such that the location of the impurity region making up a transfer section with respect to a reading gate electrode is consistent and thereafter an ion implantation process is performed. Further, an ion implantation direction is set such that the location of the electric charge accumulation region making up a light receiving section with respect to the reading gate electrode is consistent and thereafter the ion implantation process is performed.

For example, an ion implantation process with phosphorus or arsenic is performed from a direction vertical to the arrangement direction of each light receiving section having a predetermined inclination angle from a direction perpendicular to the surface of a semiconductor substrate so as to form an impurity region of a transfer section. In the case when the light receiving sections sharing the electric charge detection section are formed in one line of two pixels or three pixels or more on the semiconductor substrate, an ion implantation process with boron or the like is performed from a direction vertical to the arrangement direction of each light receiving section having a predetermined inclination angle from a direction perpendicular to the surface of the semiconductor substrate so as to form an electric charge accumulation region of each light receiving section.

Further, in the case when the plurality of light receiving sections sharing the electric charge detection section are formed in a plurality of directions of four pixels or more on the semiconductor substrate, an ion implantation direction is rotated and then an ion implantation process is sequentially performed such that an ion implantation is performed from a direction vertical to the arrangement direction of each light receiving section having a predetermined inclination angle from a direction perpendicular to the surface of the semiconductor substrate.

As a result, the location of the electric charge accumulation region making up the light receiving section with respect to the reading gate electrode becomes consistent and also, the location of the impurity region making up the transfer section with respect to the reading gate becomes consistent. Thus, it is possible to make the reading characteristic of each light receiving section consistent.

Further, the electric charge accumulation region of each light receiving section is formed so as to extend underneath the impurity region of the transfer section located under the reading gate electrode, and the impurity region of the transfer section is formed more towards the side of the light receiving section. As a result, a depression in the potential does not occur as it does conventionally, and it is possible to completely read accumulated electric charge and suppress the occurrence of a residual image and the like. Further, the electric charge accumulation region of the light receiving section is formed so as to extend deeply underneath the impurity region of the transfer section located under the reading gate electrode. Thus, it is possible to reduce a reading voltage.

As described above, according to the present invention, in a solid-state image capturing device having a electric charge detection section shared by each of a plurality of light receiving sections, by controlling an ion implantation direction, it is possible to make the location of the electric charge accumulation region making up a light receiving section consistent with respect to a gate electrode, and it is also possible make the location of the impurity region making up a transfer section consistent with respect to the gate electrode. Thus, it is possible to make the reading characteristic of each light receiving section consistent.

The electric charge accumulation region of the light receiving section is formed so as to extend deeply underneath the gate electrode, and the impurity region of the transfer section is formed more towards the side of the light receiving section. As a result, a depression in the potential does not occur as it does conventionally, and thus it is possible to completely read accumulated electric charge and suppress the occurrence of a residual image and the like. Further, the electric charge accumulation region of the light receiving section is formed so as to extend deeply underneath the reading gate electrode. Thus, it is possible to reduce a reading voltage.

These and other advantages of the present invention will become apparent to those skilled in the art upon reading and understanding the following detailed description with reference to the accompanying figures.

BRIEF DESCRIPTION OF THE DRAWINGS

Portion (a) of FIG. 1 is a top view showing a structural example of a solid-state image capturing device according to Embodiment 1 of the present invention; Portion (b) of FIG. 1 is a cross-sectional view of Portion (a) of FIG. 1 cut by a line C-C'; Portion (c) of FIG. 1 is a cross-sectional view of Portion (a) of FIG. 1 cut by a line D-D'; Portion (d) of FIG. 1 is a view showing potential, of Portion (a) of FIG. 1 cut by a line C-C', at the time of electric charge transfer; and Portion (a) of FIG. 1 is a view showing potential, of Portion (e) of FIG. 1 cut by a line D-D' at the time of electric charge transfer.

Portions (a) to (d) of FIG. 2 each are a top view for explaining each step of the method for manufacturing the solid-state image capturing device shown in Figure Portion (a) of FIG. 3 is a top view for explaining a formed state of an electric charge accumulation region of each of light receiving sections in the solid-state image capturing device shown in FIG. 1; Portion (b) of FIG. 3 is a cross-sectional view of Portion (a) of FIG. 3 cut by a line C-C'; and Portion (c) of FIG. 3 is a cross-sectional view of Portion (a) of FIG. 3 cut by a line D-D'.

Figure 4:
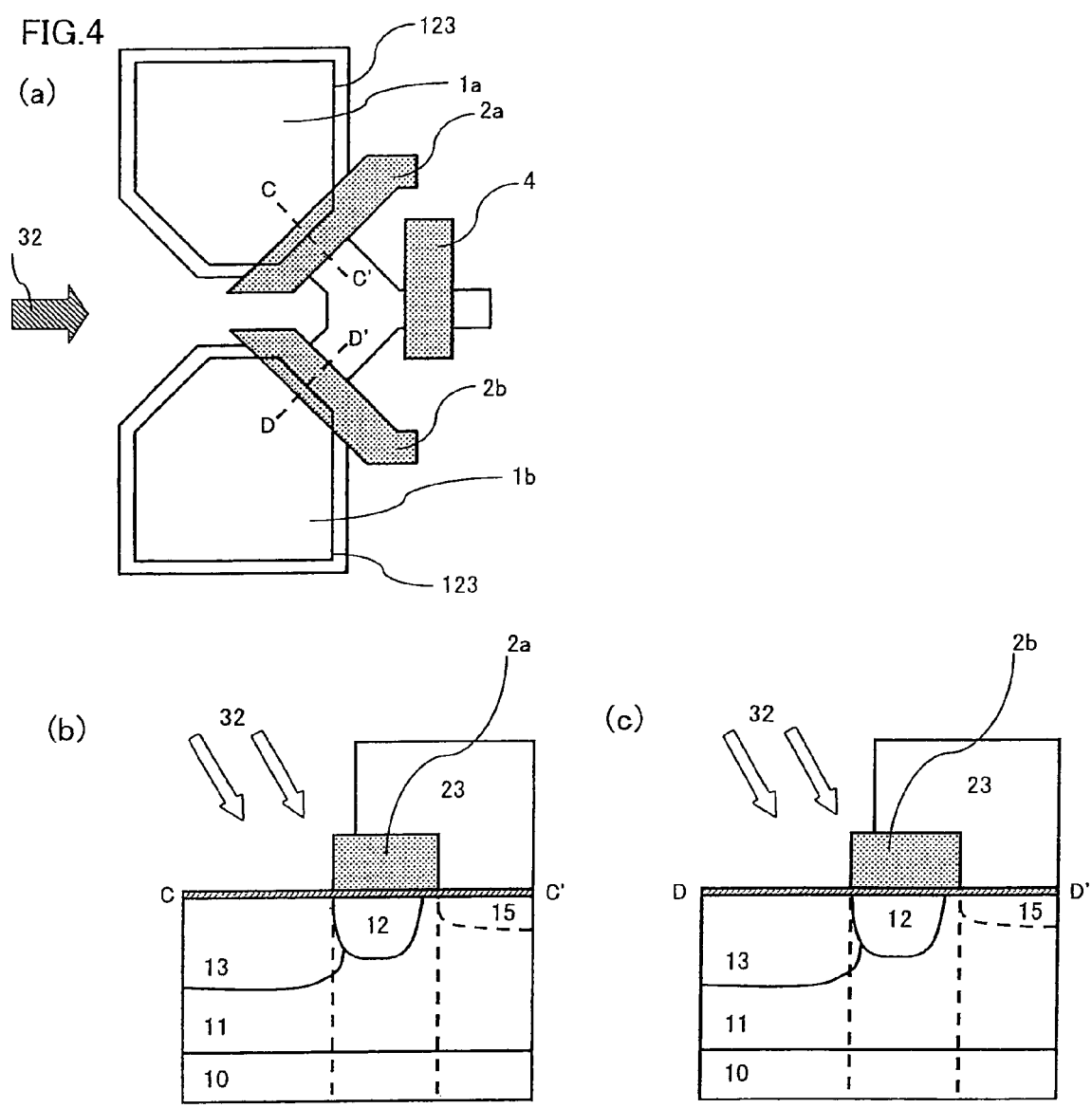

Portion (a) of FIG. 4 is a top view for explaining a formed state of an impurity region of each of transfer sections shown in FIG. 1; Portion (b) of FIG. 4 is a cross-sectional view of Portion (a) of FIG. 4 cut by aline C-C'; and Portion (c) of Figure 4 is across-sectional view of Portion (a) of FIG. 4 cut by a line D-D'.

Figure 5:
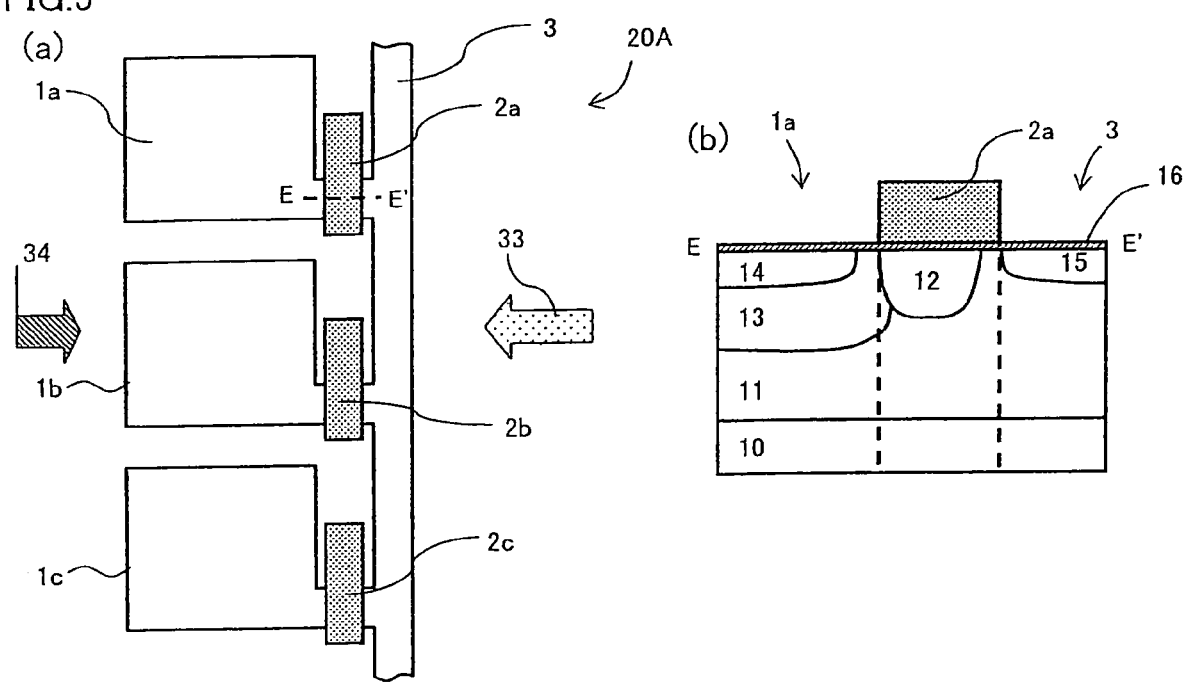

Portion (a) of FIG. 5 is a top view showing a structural example of a solid-state image capturing device according to Embodiment 2 of the present invention; and Portion (b) of FIG. 5 is a cross-sectional view of Portion (a) of FIG. 5 cut by a line E-E'.

Figure 6:
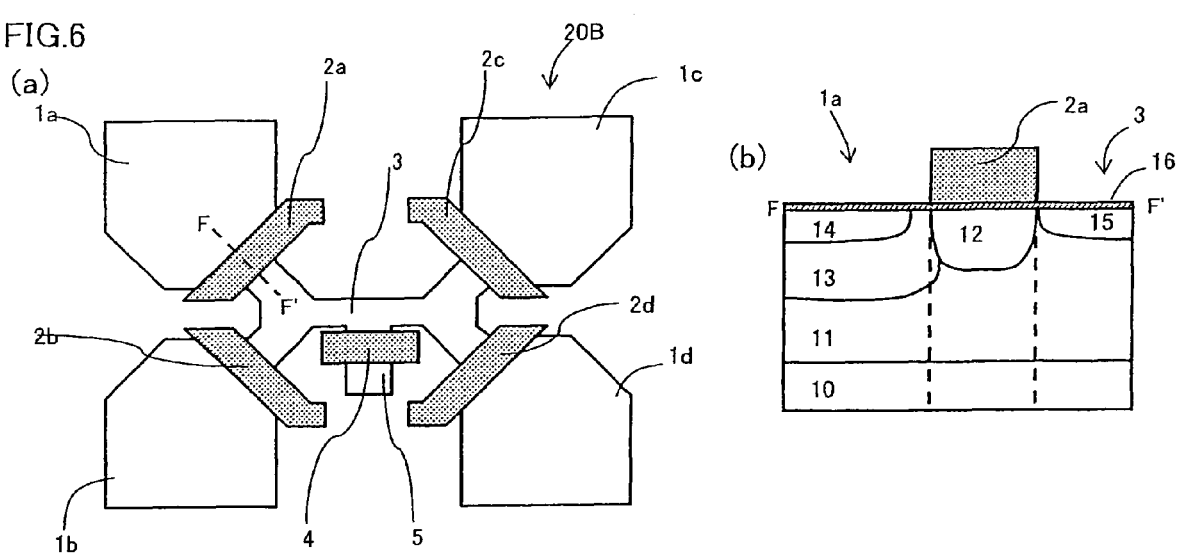

Portion (a) of FIG. 6 is a top view showing a structural example of the solid-state image capturing device according to Embodiment 3 of the present invention; and Portion (b) of FIG. 6 is a cross-sectional view of Portion (a) of FIG. 6 cut by a line F-F'.

Portion (a) of FIG. 7 is a top view showing a structure of a conventional solid image capturing device; Portion (b) of FIG. 7 is a cross-sectional view of Portion (a) of FIG. 7 cut by a line A-A'; Portion (c) of FIG. 7 is a cross-sectional view of Portion (a) of FIG. 7 cut by a line B-B'; Portion (d) of FIG. 7 is a view showing potential, of Portion (a) of FIG. 7 cut by a line A-A', at the time of electric charge transfer; and Portion (e) of FIG. 7 is a view showing potential, of Portion (a) of FIG. 7 cut by a line B-B', at the time of electric charge transfer.

Figure 8:
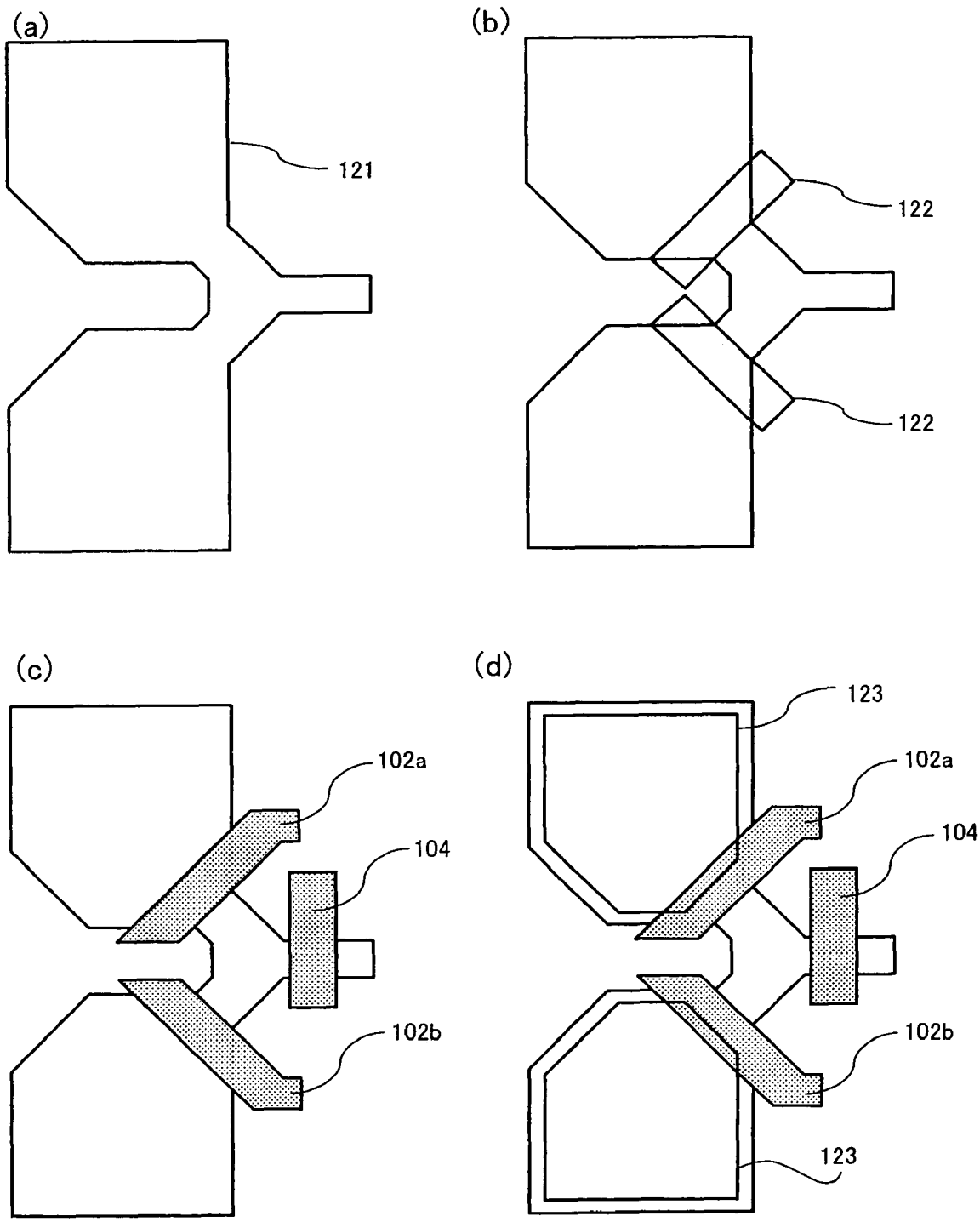

Portions (a) to (d) of FIG. 8 each show a top view for explaining each step of a method for manufacturing the conventional solid-state image capturing device shown in FIG. 7.

Portion (a) of FIG. 9 is a top view for explaining a formed state of an electric charge accumulation region of each of light receiving sections in the solid-state image capturing device shown in FIG. 7; Portion (b) of FIG. 9 is a cross-sectional view of Portion (a) of FIG. 9 cut by a line A-A'; and Portion (c) of FIG. 9 is a cross-sectional view of Portion (a) of FIG. 9 cut by a line B-B'.

Portion (a) of Figure 10 is atop view for explaining a formed state of an impurity region of transfer sections in the solid-state image capturing device shown in FIG. 7; Portion (b) of FIG. 10 is a cross-sectional view of Portion (a) of FIG. 10 cut by a line A-A'; and Portion (c) of FIG. 10 is a cross-sectional view of Portion (a) of FIG. 10 cut by a line B-B'.

1a, 1b, 1c, 1d light receiving section
2a, 2b, 2c, 2d reading gate electrode
3 electric charge detection section
4 reset gate electrode
5 reset drain section
10 N-type semiconductor substrate
11 P-type diffusion layer (P well)
12 P-type impurity region of transfer section 13 electric charge accumulation region of light receiving section
14 surface P+region of light receiving section
15 N-type impurity region
16 gate oxide film
20, 20A, 20B solid-state image capturing device
21, 22, 23 resist pattern
31, 33 ion implantation direction at the time of forming impurity region of transfer section
32, 34 ion implantation direction at the time of forming electric charge accumulation region of light receiving section

DESCRIPTION OF THE PREFERRED EMBODIMENTS

Hereinafter, Embodiments 1 to 3 of a solid-state image capturing device according to the present invention will be described with the accompanying drawings.

Embodiment 1

Embodiment 1 will describe a CMOS-type solid-state image capturing device having an electric charge detection section shared by light receiving sections of two pixel sections.

Portion (a) of FIG. 1 is a top view showing a structural example of the solid-state image capturing device according to Embodiment 1 of the present invention. Portion (b) of FIG. 1 is a cross-sectional view of Portion (a) of FIG. 1 cut by a line C-C'. Portion (c) of FIG. 1 is a cross-sectional view of Portion (a) of FIG. 1 cut by a line D-D'. Portion (d) of FIG. 1 is a view showing potential, of Portion (a) of FIG. 1 cut by a line C-C', at the time of electric charge transfer. Portion (e) of FIG. 1 is a view showing potential, of Portion (a) of FIG. 1 cut by a line D-D' at the time of electric charge transfer.

In Portions (a) to (c) of FIG. 1, the solid-state image capturing device 20 according to Embodiment 1 includes, on a semiconductor substrate 10 for each unit of two pixel sections, a plurality of light receiving sections 1a and 1b for converting incident light into signal electric charge and accumulating the electric charge; transfer sections (impurity regions 12) for reading the signal electric charge accumulated in the respective light receiving sections 1a and 1b; reading gate electrodes 2a and 2b provided on the respective transfer sections in order to control the reading of the signal electric charge accumulated in the light-receiving sections 1a and 1b; and an electric charge detection section 3 shared by the light receiving sections 1a and 1b in order to detect the read signal electric charge. Further, a reset gate electrode 4 and a reset drain section 5 for resetting signal electric charge of the electric charge detection section 3 are provided. In the solid-state image capturing device 20, a plurality of such a pair of the light receiving sections 1a and 1b (two pixel sections) is provided in an image capturing region in two dimensions.

In each of the light receiving sections 1a and 1b, the electric charge accumulation region 13 made of an N-type impurity region is provided on a P-type diffusion layer 11 over the N-type semiconductor substrate 10, and a P+ region 14 is provided at the top of each of the light receiving sections 1a and 1b. Each of the reading gate electrodes 2a and 2b is provided on the P-type impurity region 12 with a gate oxide film 16 therebetween. The reading gate electrodes 2a and 2b are provided in order to control a reading voltage of the respective transfer sections and the like. In addition, the electric charge detection section 3 is made up of an N-type impurity region 15.

Herein, a method for manufacturing the solid-state image capturing device according to Embodiment 1 will be described with reference to FIGS. 1 and 2.

Portions (a) to (d) of FIG. 2 each are a top view for explaining each step of the method for manufacturing the solid-state image capturing device shown in FIG. 1. In Embodiment 1 as well as the following Embodiments 2 and 3, the shape of a pattern for forming each implantation region is same as the one used in the method for manufacturing the conventional solid-state image capturing device 100.

As shown in Portions (b) and (c) of FIG. 1, in manufacturing the solid-state image capturing device 20 according to Embodiment 1, first, an ion implantation process with boron or the like and a thermal treatment are performed on the N-type semiconductor substrate 10 so as to form the P-type diffusion layer (P well) 11.

Next, as shown in Portion (a) of FIG. 2, a thermal oxide film (not shown) for separating an active region and an inactive region is formed by using a resist pattern 21 (having an opening therein).

Further, as shown in Portion (b) of FIG. 2, an ion implantation process with boron or the like is preformed by using a resist pattern 22 (having an opening therein). As a result, as shown in Portions (b) and (c) of FIG. 1, the impurity region 12 for controlling the reading voltage of the transfer section (P-type impurity region 12) is formed. The ion implantation process of this time is performed from a direction vertical to the arrangement direction of the light receiving sections 1a and 1b having a predetermined inclination direction from a direction perpendicular to the surface of the semiconductor substrate. In Embodiment 1, the light receiving sections 1a and 1b are formed, respectively arranged in upper and lower positions, on the semiconductor substrate wherein the electric charge detection section 3 is shared by the light receiving sections 1a and 1b. An ion implantation process is performed from a direction 31 (right to left in FIG. 2) having an inclination angle of 7 degrees with respect to a direction vertical to the surface of the semiconductor substrate, as shown in FIG. 2, such that the impurity region 12 of the transfer section is formed more towards the side of each of the light receiving sections 1a and 1b. As a result, each impurity region 12 of the transfer section can be formed at a location consistently, with respect to the gate electrode, in each of the pixels 1a and 1b respectively arranged in the upper and lower positions.

Next, agate oxide film 16 shown in Portions (b)and (c) of FIG. 1 is formed on the surface of the N-type semiconductor substrate 10 by performing a thermal oxidation treatment at a temperature of 1000 degrees Celsius to 1100 degrees Celsius in an atmosphere of $O_2$ gas and HCl gas.

Thereafter, a multi-layered film, in which, for example, a poli-silicon film and a W (tungsten) film are layered, is formed by performing a CVD (Chemical Vapour Deposition) method and a sputtering method. Then, a dry etching is performed on the resultant film. As a result, the reading gate electrodes 2a and 2b and the reset gate electrode 4 are formed, as shown in Portion (c) of FIG. Further, as shown in Portion (d) of FIG. 2, an ion implantation process with phosphorus or arsenic and a thermal treatment are performed, by using a resist pattern 23 (having an opening therein). As a result, as shown in Portions (b) and (c) of FIG. 1, the N-type impurity region is formed wherein the N-type impurity region will become the electric charge accumulation region 13 of each of the light receiving sections 1a and 1b. The electric charge accumulation sections 13 is formed in a manner of self-alignment with respect to the respective reading gate electrodes 2a and 2b. The ion implantation process of this time is performed. from a direction vertical to the arrangement direction of the light receiving sections 1a and 1b having a predetermined inclination direction from a direction perpendicular to the surface of the semiconductor substrate. In Embodiment 1, the light receiving sections 1a and 1b are formed, respectively arranged on the upper and lower positions, on the semiconductor substrate wherein the electric charge detection section 3 is shared by the light receiving sections 1a and 1b. An ion implantation process is performed from a direction 32 (left to right in FIGS. 1 and 2) having an inclination angle of 7 degrees with respect to a direction vertical to the surface of the semiconductor substrate, as shown in FIG. 2, such that the electric charge accumulation region 13 of each of the light receiving sections 1a and 1b are formed so as to extend underneath each of the respective reading gate electrodes 2a and 2b. As a result, each electric charge accumulation region 13 of the respective light receiving sections 1a and 1b can be formed at a location consistently, with respect to each of the respective gate electrodes 2a and 2b in the pixels 1a and 1b respectively arranged in the upper and lower positions.

Further, an ion implantation process with arsenic or the like is performed by using a resist pattern (not shown) so as to form the electric charge detection sections 3 (N-type impurity regions 15) and the reset drain section 5, as shown in Portions (a) to (c) of FIG. 2.

Thereafter, an ion implantation process with boron or the like and a thermal treatment are performed by using a pattern (not shown) so as to form a surface P+ region 14 of each of the light receiving sections 1a and 1b, as shown in Portions (b) of FIG. 1.

Next, a formed state of the electric charge accumulation region 13 of each of the light receiving sections 1a and 1b and a formed state of the impurity region 12 of each of the transfer sections in the solid-state image capturing device 20 according to Embodiment 1 will be described in detail with reference to FIGS. 3 and 4.

Portion (a) of FIG. 3 is a top view for explaining the formed state of the electric charge accumulation region 13 of each of the light receiving sections 1a and 1b in the solid-state image capturing device 20 shown in FIG. 1. Portion (b) of FIG. 3 is a cross-sectional view of Portion (a) of FIG. 3 cut by a line C-C'. Portion (c) of FIG. 3 is a cross-sectional view of Portion (a) of FIG. 3 cut by a line D-D'. Portion (a) of FIG. 4 is a top view for explaining the formed state of the impurity region 12 of each of the transfer sections in the solid-state image capturing device 20 shown in FIG. 1. Portion (b) of FIG. 4 is a cross-sectional view of Portion (a) of FIG. 4 cut by a line C-C'. Portion (c) of FIG. 4 is a cross-sectional view of Portion (a) of FIG. 4 cut by a line D-D'.

In manufacturing the CMOS-type solid-state image capturing device 20 according to Embodiment 1, the electric charge accumulation region 13 of each of the light receiving sections 1a and 1b and the impurity region 12 of each of the transfer sections are formed by performing an ion implantation process.

As shown in Portions (a) to (c) of FIG. 3, an ion implantation process with boron for the impurity region 12 of the transfer section is performed in the implantation direction 31 (from right to left in the figure). Thus, due to the influence of the shadowing of the resist pattern 22, the impurity region 12 of the transfer section is formed more towards the side of each of the light receiving sections 1a and 1b with respect to each of the respective reading gate electrodes 2a and 2b. Therefore, the location of the impurity region 12 of each of the transfer sections with respect to each of the respective reading gate electrodes 2a and 2b is consistent in the pixel sections respectively arranged in the upper and lower positions.

As shown in Portions (a) to (c) of FIG. 4, an ion implantation process with phosphorus or arsenic for the electric charge accumulation region 13 of each of the light receiving sections 1a and 1b is performed in the implantation direction 32 (from left to right in the figure). Thus, the influence of the shadowing of the resist pattern 23 is reduced, and the electric charge accumulation region 13 of each of the light receiving sections 1a and 1b is formed so as to extend underneath each of the respective reading gate electrodes 2a and 2b. Therefore, the location of the electric charge accumulation region 13 of each of the respective light receiving sections 1a and 1b with respect to each of the respective reading gate electrodes 2a and 2b is consistent in the pixel sections respectively arranged in the upper and lower positions.

As a result, the location of the impurity region 12 of each of the transfer sections with respect to each of the respective reading gate electrodes become consistent in the pixel sections respectively arranged in the upper and lower positions, and the location of the electric charge accumulation region 13 of each of the respective light receiving sections 1a and 1b with respect to each of the respective reading gate electrodes 2a and 2b become consistent in the pixel sections respectively arranged in the upper and lower positions. Thus, it is possible to make the reading characteristic of each of the light receiving section 1a and 1b consistent.

In Portions (d) and (e) of FIG. 1, vertical axes each show potential along a left-to-right position of each of corresponding sections. At the time of electric charge transfer, the potential of the transfer section is lowered by applying a predetermined voltage to the reading gates electrodes 2a and 2b. As a result, the signal electric charge accumulated in the electric charge accumulation region 13 of each of the light receiving sections 1a and 1b is read to the electric charge detection section 3 (impurity region 15) through the transfer section (impurity region 12).

Arsenic or phosphorus is implanted, from the implantation direction 32, into the electric charge accumulation region 13 of each of the light receiving sections 1a and 1b, and boron is implanted, from the implantation direction 31, in the impurity region 12 of the transfer section. As a result, the electric charge accumulation region 13 of each of the light receiving sections 1a and 1b is formed so as to extend underneath the impurity region 12 of each of the respective reading gate electrodes 2a and 2b, and the impurity region 12 of each of the transfer sections is formed more towards the side of each of the light receiving section 1a and 1b with respect to each of the respective reading gate electrodes 2a and 2b. In this case, a depression 117 in the potential does not occur as it does in the conventional method for manufacturing a solid-state image capturing device. Thus, it is possible to completely read the electric charge accumulated in the light receiving sections 1a and 1b and suppress the occurrence of a residual image and the like. Further, the electric charge accumulation region 13 of each of the light receiving sections 1a and 1b is formed so as to extend underneath the impurity region 12 of each of the transfer sections located under each of the respective reading gate electrodes 2a and 2b. Thus, a depression 117 in the potential does not occur and the influence of a voltage, which is applied to the reading gate electrodes 2a and 2b, to the electric charge accumulation region 13 is reduced, which results in reducing a reading voltage.

In Embodiment 1, as shown in Portions (a) to (c) of FIG. 1, a description has been made regarding a structure in which the electric charge detection section 3 is shared by pixels respectively arranged in the upper and lower positions. However, in the structure having the electric charge detection section 3 shared by the two light receiving sections 1a and 1b, the direction of arranging the pixels is not limited to the top/bottom direction (or longitudinal direction). Also, a left/right direction (or lateral direction crossing the longitudinal direction) or a diagonal direction can be used. Any direction of arranging the pixels can be applied as long as (i) the implantation direction 31 for the impurity region 12 of the transfer section is a direction in which the impurity region 12 of the transfer section is formed towards the side of each of the light receiving sections 1a and 1b with respect to each of the respective reading gate electrodes 2a and 2b and (ii) the implantation direction 32 for the electric charge accumulation region 13 of each of the light receiving section 1a and 1b is a direction 32 in which the electric charge accumulation region 13 of each of the light receiving section 1a and 1b is formed so as to extend underneath each of the respective reading gate electrodes 2a and 2b.

Embodiment 2

Embodiment 2 will describe a CMOS-type solid-state image capturing device having an electric charge detection section shared by light receiving sections of three or more pixels arranged in one line.

Portion (a) of FIG. 5 is a top view showing a structural example of the solid-state image capturing device according to Embodiment 2 of the present invention. Portion (b) of FIG. 5 is a cross-sectional view of Portion (a) of FIG. 5 cut by a line E-E'.

In Portions (a) and (b) of FIG. 5, the solid-state image capturing device 20A according to Embodiment 2 includes, on a semiconductor substrate 10, a plurality of light receiving sections 1a, 1b, 1c, ... arranged in one line in a top/bottom direction; a plurality of reading gate electrodes 2a, 2b, 2c, ... provided over respective transfer sections (impurity regions 12) in order to read signal electric charge accumulated in the respective light receiving sections 1a, 1b, 1c, ... ; and an electric charge detection section 3 shared by the light receiving sections 1a, 1b, 1c, ... in order to detect the read signal electric charge. In the solid-state image capturing device 20A, a plurality of sets of such light receiving sections 1a, 1b, 1c, ... is provided in an image capturing region in two dimensions.

In each of the light receiving sections 1a, 1b, 1c, ... , an electric charge accumulation region 13 made of an N-type impurity region is provided on a P-type diffusion layer 11 over the N-type semiconductor substrate 10, and a P+ region 14 is provided on at the top of each of the light receiving sections 1a, 1b, 1c, .... Each of the reading gate electrodes 2a, 2b, 2c, ... is provided on the P-type impurity region 12 with a gate oxide film 16 therebetween. The reading gate electrodes 2a, 2b, 2c, ... are provided in order to control a reading voltage of the respective transfer sections (impurity regions 12) and the like. In addition, the electric charge detection section 3 is made up of an N-type impurity region 15.

In the solid-state image capturing device 20A according to Embodiment 2, the light receiving sections 1a, 1b, 1c, ... are arranged in a top/bottom direction. Thus, an ion implantation process with boron for the impurity region 12 of each of the transfer sections is performed in an implantation direction 33 (from right to left in the figure), as shown in Portion (a) of FIG. 5. As a result, the impurity region 12 of each of the transfer sections is formed more towards the side of each of the respective light receiving sections 1a, 1b, 1c, ... with respect to each of the respective reading gate electrodes 2a, 2b, 2c, .... Thus, each impurity region 12 of the transfer section can be formed at a location consistently, with respect to each of the respective reading gate electrodes 2a, 2b, 2c, ... in each of the plurality of respective pixels.

The light receiving sections 1a, 1b, 1c, ... are arranged in the top/bottom direction. Thus, an ion implantation process with arsenic or phosphorus for the electric charge accumulation region 13 of each of the light receiving sections 1a, 1b, 1c, ... is performed in an implantation direction 34 (from left to right in the figure), as shown in Portion (a) of FIG. 5. As a result, the electric charge accumulation region 13 of each of the light receiving sections 1a, 1b, 1c, ... is formed so as to extend underneath each of the respective reading gate electrodes 2a, 2b, 2c, .... Thus, each electric charge accumulation region 13 of the respective light receiving sections 1a, 1b, 1c, ... can be formed at a location consistently, respect to each of the respective the reading gate electrode 2a, 2b, 2c, ... in each of the plurality of respective pixels.

As a result, the location of the impurity region 12 of each of the transfer sections with respect to each of the respective reading gate electrodes 2a, 2b, 2c ... become consistent in each of the plurality of respective pixels, and the location of the electric charge accumulation region of each of the respective light receiving sections 1a, 1b, 1c ... with respect to each of the respective reading gate electrodes 2a, 2b, 2c ... become consistent in each of the plurality of respective pixels. Thus, it is possible to make the reading characteristic of each of the light receiving sections 1a, 1b, 1c ... consistent. Further, the electric charge accumulation region 13 of each of the light receiving sections 1a, 1b, 1c ... is formed so as to extend deeply underneath each of the respective reading gate electrodes 2a, 2b, 2c ..., and the impurity region 12 of each of the transfer sections is formed more towards the side of each of the light receiving sections 1a, 1b, 1c ... with respect to each of the respective reading gate electrodes 2a, 2b, 2c ... As a result, a depression 117 in the potential does not occur as it does in the conventional method for manufacturing a solid-state image capturing device. Thus, it is possible to completely read the electric charge accumulated in the light receiving sections 1a, 1b, 1c ... and suppress the occurrence of a residual image and the like. Further, the electric charge accumulation region 13 of each of the light receiving sections 1a, 1b, 1c ... is formed so as to extend underneath the impurity region 12 of each of the transfer sections located under each of the respective reading gate electrodes 2a, 2b, 2c ... Thus, it is possible to reduce a reading voltage.

In Embodiment 2, as shown in FIG. 5, a description has been made regarding a structure in which the electric charge detection section 3 is shared by the pixels respectively arranged in the upper and lower positions. However, in the structure having the electric charge detection section 3 shared by the three or more light receiving sections 1a, 1b, 1c ... , the direction of arranging the pixels is not limited to the top/bottom direction (or longitudinal direction). Also, a left/right direction (or lateral direction crossing the longitudinal direction) or a diagonal direction can be used. Any direction of arranging the pixels can be applied as long as (i) the implantation direction for the impurity region 12 of the transfer section is a direction in which the impurity region 12 of the transfer section is formed more towards the side of each of the light receiving sections 1a, 1b, 1c ... with respect to each of the respective reading gate electrodes 2a, 2b, 2c ... and (ii) the implantation direction for the electric charge accumulation region 13 of each of the light receiving sections 1a, 1b, 1c ... is a direction in which the electric charge accumulation region 13 of each of the light receiving sections 1a, 1b, 1c . . . is formed so as to extend deeply underneath each of the respective reading gate electrodes 2a, 2b, 2c . . .

Embodiment 3

Embodiment 3 will describe a CMOS-type solid-state image capturing device having an electric charge detection section shared by light receiving sections of four pixels.

Portion (a) of FIG. 6 is a top view showing a structural example of the solid-state image capturing device according to Embodiment 3 of the present invention. Portion (b) of FIG. 6 is a cross-sectional view of Portion (a) of FIG. 6 cut by a line F-F'.

In Portions (a) and (b) of FIG. 6, the solid-state image capturing device 20B according to Embodiment 3 includes, on a semiconductor substrate 10 for each unit of four pixel sections, a plurality of light receiving sections 1a to 1d; a plurality of reading gate electrodes 2a to 2d provided on respective transfer sections in order to read signal electric charge accumulated in the respective light receiving sections 1a to 1d; and an electric charge detection section 3 shared by the light receiving sections 1a to 1d in order to detect the read signal electric charge. In the solid-state image capturing device 20B, a plurality of sets of such light receiving sections 1a to 1d is provided in an image capturing region in two dimensions.

In each of the light receiving sections 1a to 1d, an electric charge accumulation region 13 made of an N-type impurity region is provided on a P-type diffusion layer 11 over the N-type semiconductor substrate 10, and a P+ region 14 is provided at the top of each of the light receiving sections 1a to 1d. Each of the reading gate electrodes 2a to 2d is provided on a P-type impurity region 12 with a gate oxide film 16 therebetween. The reading gate electrodes 2a to 2d are provided in order to control a reading voltage of the respective transfer sections and the like. In addition, the electric charge detection section 3 is made up of an N-type impurity region 15.

In a structure having the electric charge detection section 3 shared by the light receiving sections 1a to id of four pixel sections or more (four pixel sections in Embodiment 3), in the case when the pixel sections are arranged in a plurality of directions, when an ion implantation process is performed in one implantation direction, it is impossible to make the location of the impurity regions 12 making up the transfer section in the respective pixel sections consistent and also impossible to make the location of the electric charge accumulation region 13 making up each of the light receiving sections 1a to 1d in the respective pixel sections consistent.

Accordingly, in Embodiment 3, when an implantation is performed on the impurity region 12 of each of the transfer sections and the electric charge accumulation region of each of the light receiving sections 1a to 1d, the ion implantation direction is controlled by rotating the substrate such that the location of the impurity region 12 of each of the transfer sections in the respective pixel sections with respect to each of the respective reading gate electrodes become consistent, and the location of the electric charge accumulation region of each of the light receiving sections 1a and 1b in the respective pixel sections with respect to each of the respective reading gate electrodes become consistent. In this case, a method is considered in which an ion implantation process is performed on the light receiving sections 1a and 1b and thereafter, the substrate is rotated by 180 degrees and then an ion implantation process is performed on the light receiving sections 1a and 1d. An ion implantation for the electric charge accumulation region 13 of each of the light receiving sections is performed in a similar manner.

As a result, the location of the impurity region 12 of each of the transfer sections with respect to each of the respective reading gate electrodes 2a to 2d become consistent in each of the plurality of pixel sections, and the location of the electric charge accumulation region 13 of each of the light receiving sections 1a to 1d with respect to each of the respective reading gate electrodes 2a to 2d become consistent in each of the plurality of pixel sections. Thus, it is possible to make the reading characteristic of each of the light receiving sections 1a to 1d consistent.

As described above, according to Embodiments 1 to 3, the location of the impurity region 12 of the transfer section with respect to each of the respective reading gate electrodes 2a and 2b is consistent at the time of forming the impurity region 12. An ion implantation process with phosphorus or arsenic is performed from a direction 31, which is vertical to the arrangement direction of the light receiving sections 1a and 1b, having a predetermined inclination angle from a direction perpendicular to the surface of a semiconductor substrate 10 such that the impurity region 12 is formed more towards the side of each of light receiving sections 1a and 1b. Next, for example, the location of the electric charge accumulation region 13 of each of the two light receiving sections 1a and 1b with respect to each of the respective reading gate electrodes 2a and 2b is consistent at the time of forming the electric charge accumulation region 13. An ion implantation process with boron or the like is performed from a direction 32, which is vertical to the arrangement direction of the light receiving sections 1a and 1b, having a predetermined inclination angle from a direction perpendicular to the surface of the semiconductor substrate 10 such that the electric charge accumulation 13 is formed so as to extend deeply underneath each of the reading gate electrodes 2a and 2b. As described above, by controlling the ion implantation directions, in the solid-state image capturing device having the electric charge detection section shared by the plurality of light receiving sections, it is possible to make the reading characteristic of each light receiving section consistent and it is also possible to reduce a reading voltage.

Although a description has not been specifically given in Embodiments 1 to 3 described above, in a method according to the present invention for manufacturing a solid-state image capturing device, in which from a plurality of light receiving sections for photoelectrically converting incident light into signal electric charge, the signal electric charge is read to an electric charge detection section through transfer sections located under respective reading gate electrodes, each electric charge detection being shared by each of the plurality of light receiving sections, as long as the method includes: a transfer section impurity region forming step of performing an ion implantation process from an ion implantation direction wherein the location of an edge surface of an impurity region of the transfer section and the location of an edge surface of the reading gate electrode corresponding to the impurity region match each other at each reading gate electrode; and an electric charge accumulation forming step of performing an ion implantation process from an ion implantation direction wherein the location of an edge surface of an electric charge accumulation region of the light receiving section and the location of an edge surface of the reading gate electrode corresponding to the electric charge accumulation region match each other at each of the light receiving sections, the objective of the present invention that the reading characteristic of each light receiving section is made consistent, thereby achieving the reduction of a reading voltage can be achieved. In this case, it is preferable that a direction vertical to the arrangement direction of the plurality of light receiving sections in the transfer section impurity region forming step and a direction vertical to the arrangement direction of the plurality of light receiving sections in the electric charge accumulation region forming step are opposite to each other and face each other.

Further, although a description has not been specifically given in Embodiments 1 to 3 described above, in a method according to the present invention for manufacturing a solid-state image capturing device, in which from a plurality of light receiving sections for photoelectrically converting incident light into signal electric charge, the signal electric charge is read to an electric charge detection section through transfer sections located under respective reading gate electrodes, each electric charge detection being shared by each of the plurality of light receiving sections, as long as the method includes: a transfer section impurity region forming step of performing an ion implantation process from an ion implantation direction wherein the location of an edge surface of the impurity region of the transfer section and the location of an edge surface of the reading gate electrode corresponding to the impurity region match each other at each reading gate electrode, the objective of the present invention that the reading characteristic of each light receiving section is made consistent, thereby reducing the reduction of a reading voltage can be achieved (compared to the conventional technique even if not sufficient) by performing an ion implantation process in a situation in which the location of an edge surface of the impurity region of the transfer section and the location of an edge surface of the reading gate electrode corresponding to the impurity region match each other at each reading gate electrode in the transfer section impurity region forming step; and the location of an edge surface of an electric charge accumulation region of the light receiving section and the location of an edge surface of the reading gate electrode corresponding to the electric charge accumulation region do not match each other at each of the light receiving sections in an electric charge accumulation forming step.

Furthermore, although a description has not been specifically given in Embodiments 1 to 3 described above, herein the description will be made regarding an electronic information device having, for example, a digital camera (e.g., digital video camera and digital still camera) or an image input device (e.g., image input camera, scanner, facsimile and cellular phone device equipped with a camera) using at least one of the solid-state image capturing devices 20, 20A and 20B according to Embodiments 1 to 3 of the present invention described above as an image capturing section therein. The electronic information device according to the present invention includes at least one of: a memory section (e.g., recording medium) for recording high-quality image data after a predetermined signal process is performed on the image data for recording, wherein the image data is obtained by using the at least one of the solid-state image capturing devices 20, 20A and 20B according to Embodiments 1 to 3 of the present invention described above as an image capturing section therein; display means (e.g., liquid crystal display device) for displaying the image data on a display screen (e.g., liquid crystal display screen) after a predetermined signal process is performed on the image data for display; communication means (e.g., communication device) for communicating the image data after a predetermined signal process is performed on the image data for communication; and image output means for printing and outputting (printing out) the image data as information image.

As described above, the present invention is exemplified by the use of its preferred Embodiments 1 to 3. However, the present invention should not be interpreted solely based on Embodiments 1 to 3 described above. It is understood that the scope of the present invention should be interpreted solely based on the claims. It is also understood that those skilled in the art can implement equivalent scope of technique, based on the description of the present invention and common knowledge from the description of the detailed preferred Embodiments 1 to 3 of the present invention. Furthermore, it is understood that any patent, any patent application and any references cited in the present specification should be incorporated by reference in the present specification in the same manner as the contents are specifically described therein.

INDUSTRIAL APPLICABILITY

In the field of: a solid-state image capturing device capable of making the reading characteristic in each of a plurality of pixel sections consistent when an electric charge detection section is shared by the plurality of pixel sections; a method for manufacturing the solid-state image capturing device; and an electronic information device the solid-state image capturing device as an image capturing section therein, by controlling an ion implantation direction, it is possible to make the location of the electric charge accumulation region making up a light receiving section consistent with respect to a gate electrode, and it is also possible make the location of the impurity region making up a transfer section consistent with respect to the gate electrode. Thus, it is possible to make the reading characteristic of each light receiving section consistent.

The electric charge accumulation region of the light receiving section is formed so as to extend deeply underneath the gate electrode, and the impurity region of the transfer section is formed more towards the side of the light receiving section. As a result, a depression in the potential does not occur as it does conventionally, and thus it is possible to completely read accumulated electric charge and suppress the occurrence of a residual image and the like. Further, the electric charge accumulation region of the light receiving section is formed so as to extend deeply underneath the reading gate electrode. Thus, it is possible to reduce a reading voltage.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for manufacturing a solid-state image capturing device that includes a plurality of light receiving sections for photoelectrically converting incident light into signal electric charge, the signal electric charge is read to an electric charge detection section through transfer sections located under respective reading gate electrodes, each electric charge detection being shared by each of the plurality of light receiving sections, the method comprising the step(s) of:

a transfer section impurity region forming step of performing an ion implantation process from a first ion implantation direction, the first ion implantation direction being set so that a location of an edge surface of an impurity region of the transfer section, which is between the impurity region of the transfer section and an electric charge accumulation region of the light receiving section, coincides with a location of an edge surface of the reading gate electrode corresponding to the impurity region at the boundary between them at each reading gate electrode;

an electric charge accumulation forming step of performing another ion implantation process from a second ion implantation direction, the second ion implantation direction being set so that a location of an edge surface of the electric charge accumulation region of the light receiving section and a location of an edge surface of the reading gate electrode corresponding to the electric charge accumulation region coincide at the boundary between them; and wherein the electric charge accumulation region forming step performs the second ion implantation process from a direction on the side of the light receiving section with respect to the reading gate electrode such that the electric charge accumulation region is formed so as to extend beyond said edge surface of the reading gate electrode and so as to extend underneath the impurity region of the transfer section located under the reading gate electrode.

2. A method for manufacturing a solid-state image capturing device according to claim 1, wherein:
the plurality of light receiving sections sharing the electric charge detection section are arranged and formed in one line on the semiconductor substrate,
the transfer section impurity region forming step performs the first ion implantation process from a direction vertical to an arrangement direction of the plurality of light receiving sections having a predetermined inclination angle from a direction perpendicular to a surface of the semiconductor substrate such that the location of the impurity region making up each of the transfer sections with respect to each of the respective reading gate electrodes is consistent, and
the electric charge accumulation region forming step performs the second ion implantation process from a direction vertical to an arrangement direction of the plurality of light receiving sections having a predetermined inclination angle from a direction perpendicular to the surface of the semiconductor substrate such that the location of the electric charge accumulation region making up each of the plurality of light receiving sections with respect to each of the respective reading gate electrodes is consistent.

3. A method for manufacturing a solid-state image capturing device according to claim 2, wherein the plurality of light receiving sections sharing the electric charge detection section are arranged on the semiconductor substrate in a top/bottom direction, a left/right direction or a diagonal direction.

4. A method for manufacturing a solid-state image capturing device according to claim 1, wherein:
the plurality of light receiving sections sharing the electric charge detection section are arranged and formed on the semiconductor substrate in a plurality of directions,
the transfer section impurity region forming step performs the first ion implantation process by changing the first ion implantation direction with respect to the semiconductor substrate, so that the first ion implantation process is performed from a direction vertical to an arrangement direction of the plurality of light receiving sections having a predetermined inclination angle from a direction perpendicular to a surface of the semiconductor substrate such that the location of the impurity region making up each of the transfer sections with respect to each of the respective reading gate electrodes is consistent, and
the electric charge accumulation region forming step performs the second ion implantation process by changing the second ion implantation direction with respect to the semiconductor substrate, so that the second ion implantation process is performed from a direction vertical to an arrangement direction of the plurality of light receiving sections having a predetermined inclination angle from a direction perpendicular to the surface of the semiconductor substrate such that the location of the electric charge accumulation region making up each of the light receiving sections with respect to each of the respective reading gate electrodes is consistent.

5. A method for manufacturing a solid-state image capturing device according to claim 4, wherein the plurality of light receiving sections sharing the electric charge detection section is arranged on the semiconductor substrate in a top/bottom direction and a left/right direction.

6. A method for manufacturing a solid-state image capturing device according to claim 1, wherein the transfer section impurity region forming step performs the first ion implantation process from a direction opposite to the light receiving section with respect to the reading gate electrode such that the impurity region of the transfer section is formed adjacent to the light receiving section.

7. A method for manufacturing a solid-state image capturing device according to claim 1, wherein arsenic or phosphorus is implanted into a P-type diffusion layer on an N-type semiconductor substrate in order to form the electric charge accumulation region of the light receiving section, and boron is implanted into the P-type diffusion layer on the N-type semiconductor substrate in order to form the impurity region of the transfer section.

8. A method for manufacturing a solid-state image capturing device according to claim 2, wherein the vertical direction in the transfer section impurity region forming step and the vertical direction in the electric charge accumulation region forming step are opposite to each other and face each other.

9. A method for manufacturing a solid-state image capturing device according to claim 4, wherein the changing the first ion implantation direction in the transfer impurity region forming step and the changing the second ion implantation direction in the electric charge accumulation region forming step are performed by rotating the semiconductor substrate or the respective ion implantation direction.

10. A solid-state image capturing device manufactured by a method for manufacturing a solid-state image capturing device according to claim 1, wherein:
the location of an electric charge accumulation region making up each of plurality of light receiving sections sharing an electric charge detection section with respect to each of respective reading gate electrodes is consistent, and
the location of an impurity region making up each of transfer sections with respect to each of the respective reading gate electrodes is consistent.

11. An electronic information device using a solid-state image capturing device according to claim 10 as an image capturing section therein.

12. A method for manufacturing a solid-state image capturing device, the solid-state image capturing device including:
on a semiconductor substrate, a plurality of light receiving sections for converting incident light into signal electric charge and accumulating the signal electric charge;
transfer sections for reading the signal electric charge accumulated in the plurality of respective light receiving sections;
reading gate electrodes provided over the respective transfer sections in order to control the reading of the signal electric charge accumulated in the plurality of respective light receiving sections; and
an electric charge detection section shared by the light receiving sections of a plurality of pixels in order to detect the signal electric charge read through the respective transfer sections,
the method comprising the step(s) of:
a transfer section impurity region forming step of setting a first ion implantation direction, the first ion implantation direction being set so that a location of an edge of an impurity region of each of the transfer sections, which is between the impurity region of the transfer section and an electric charge accumulation region of the light receiving section, coincides with a location of an edge of each of the respective reading gate electrodes at the boundary between them and is consistent, and performing an ion implantation from the first ion implantation direction so as to form the impurity region of each of the transfer sections;

an electric charge accumulation region forming step of setting a second ion implantation direction, the second ion implantation direction being set so that a location of an edge of the electric charge accumulation region of each of the light receiving sections with respect to a location of an edge of each of the respective reading gate electrodes coincide at the boundary between them and is consistent, and performing an ion implantation from the second ion implantation direction so as to form the electric charge accumulation region of each of the light receiving sections; and wherein the electric charge accumulation region forming step performs the second ion implantation process from a direction on the side of the light receiving section with respect to the reading gate electrode such that the electric charge accumulation region is formed so as to extend beyond said edge surface of the reading gate electrode and so as to extend underneath the impurity region of the transfer section located under the reading gate electrode.

13. A method for manufacturing a solid-state image capturing device according to claim 12, wherein:
the plurality of light receiving sections sharing the electric charge detection section are arranged and formed in one line on the semiconductor substrate,
the transfer section impurity region forming step performs the first ion implantation process from a direction vertical to an arrangement direction of the plurality of light receiving sections having a predetermined inclination angle from a direction perpendicular to a surface of the semiconductor substrate such that the location of the impurity region making up each of the transfer sections with respect to each of the respective reading gate electrodes is consistent, and
the electric charge accumulation region forming step performs the second ion implantation process from a direction vertical to an arrangement direction of the plurality of light receiving sections having a predetermined inclination angle from a direction perpendicular to the surface of the semiconductor substrate such that the location of the electric charge accumulation region making up each of the plurality of light receiving sections with respect to each of the respective reading gate electrodes is consistent.

14. A method for manufacturing a solid-state image capturing device according to claim 13, wherein the plurality of light receiving sections sharing the electric charge detection section is arranged on the semiconductor substrate in a top/bottom direction, a left/right direction or a diagonal direction.

15. A method for manufacturing a solid-state image capturing device according to claim 12, wherein:
the plurality of light receiving sections sharing the electric charge detection section are arranged and formed on the semiconductor substrate in a plurality of directions,
the transfer section impurity region forming step performs the first ion implantation process by changing the first ion implantation direction with respect to the semiconductor substrate, so that the first ion implantation process is performed from a direction vertical to an arrangement direction of the plurality of light receiving sections having a predetermined inclination angle from a direction perpendicular to a surface of the semiconductor substrate such that the location of the impurity region making up each of the transfer sections with respect to each of the respective reading gate electrodes is consistent, and
the electric charge accumulation region forming step performs the second ion implantation process by changing the second ion implantation direction with respect to the semiconductor substrate, so that the second ion implantation process is performed from a direction vertical to an arrangement direction of the plurality of light receiving sections having a predetermined inclination angle from a direction perpendicular to the surface of the semiconductor substrate such that the location of the electric charge accumulation region making up each of the light receiving sections with respect to each of the respective reading gate electrodes is consistent.

16. A method for manufacturing a solid-state image capturing device according to claim 15, wherein the plurality of light receiving sections sharing the electric charge detection section is arranged on the semiconductor substrate in a top/bottom direction and a left/right direction.

17. A method for manufacturing a solid-state image capturing device according to claim 12, wherein the transfer section impurity region forming step performs the first ion implantation process from a direction opposite to the light receiving section with respect to the reading gate electrode such that the impurity region of the transfer section is formed adjacent to the light receiving section.

18. A method for manufacturing a solid-state image capturing device according to claim 12, wherein arsenic or phosphorus is implanted into a P-type diffusion layer on an N-type semiconductor substrate in order to form the electric charge accumulation region of the light receiving section, and boron is implanted into the P-type diffusion layer on the N-type semiconductor substrate in order to form the impurity region of the transfer section.

19. A method for manufacturing a solid-state image capturing device according to claim 13, wherein the vertical direction in the transfer section impurity region forming step and the vertical direction in the electric charge accumulation region forming step are opposite to each other and face each other.

20. A method for manufacturing a solid-state image capturing device according to claim 15, wherein the changing the first ion implantation direction in the transfer impurity region forming step and the changing the second ion implantation direction in the electric charge accumulation region forming step are performed by rotating the semiconductor substrate or the respective ion implantation direction.

21. A solid-state image capturing device manufactured by a method for manufacturing a solid-state image capturing device according to claim 12, wherein:
the location of an electric charge accumulation region making up each of plurality of light receiving sections sharing an electric charge detection section with respect to each of respective reading gate electrodes is consistent, and
the location of an impurity region making up each of transfer sections with respect to each of the respective reading gate electrodes is consistent.

22. An electronic information device using a solid-state image capturing device according to claim 21 as an image capturing section therein.

* * * * *